(12) United States Patent
Fino et al.

(10) Patent No.: US 7,916,491 B2
(45) Date of Patent: Mar. 29, 2011

(54) ELECTRONIC CONTROL UNIT WITH EXPANDED BLOCKS

(75) Inventors: Endrio Fino, Romano Canavese (IT); Fulvio Cicognati, Chieri (IT)

(73) Assignee: Magnetti Marelli Powertrain S.p.A. (IT)

( * ) Notice: Subject to any disclaimer, the term of this patent is extended or adjusted under 35 U.S.C. 154(b) by 389 days.

(21) Appl. No.: 12/122,824

(22) Filed: May 19, 2008

(65) Prior Publication Data

US 2008/0310131 A1  Dec. 18, 2008

(30) Foreign Application Priority Data

May 21, 2007  (EP) ..................................... 07425297

(51) Int. Cl.
*H05K 7/14* (2006.01)
(52) U.S. Cl. ........ 361/752; 361/704; 361/707; 174/520; 174/521
(58) Field of Classification Search .................. 361/752, 361/730; 174/520
See application file for complete search history.

(56) References Cited

U.S. PATENT DOCUMENTS

| | | | | |
|---|---|---|---|---|
| 4,233,645 A | * | 11/1980 | Balderes et al. | 361/698 |
| 4,409,641 A | * | 10/1983 | Jakob et al. | 361/720 |
| 5,060,113 A | * | 10/1991 | Jacobs | 361/721 |
| 5,243,131 A | * | 9/1993 | Jakob et al. | 174/536 |
| 5,623,394 A | * | 4/1997 | Sherif et al. | 361/705 |
| 5,699,235 A | * | 12/1997 | Tsurumiya et al. | 361/803 |
| 5,808,868 A | | 9/1998 | Drekmeier | |
| 5,909,915 A | * | 6/1999 | Okuda | 29/841 |
| 6,275,381 B1 | * | 8/2001 | Edwards et al. | 361/717 |
| 6,317,324 B1 | * | 11/2001 | Chen et al. | 361/704 |
| 6,445,568 B1 | * | 9/2002 | Baur et al. | 361/600 |
| 6,656,770 B2 | * | 12/2003 | Atwood et al. | 438/118 |
| 7,023,699 B2 | * | 4/2006 | Glovatsky et al. | 361/704 |
| 2005/0068750 A1 | | 3/2005 | Origlia | |

FOREIGN PATENT DOCUMENTS

EP  0 652 694 A1  5/1995
EP  1 381 262 A3  1/2004

OTHER PUBLICATIONS

European Search Report dated Dec. 14, 2007 issued in corresponding European Patent Application No. 07425297.4.

* cited by examiner

*Primary Examiner* — Dameon E Levi
(74) *Attorney, Agent, or Firm* — Ostrolenk Faber LLP

(57) ABSTRACT

An electronic control unit includes: a printed circuit board, which supports an electric circuit, a plurality of electronic components electrically connected to the electric circuit, and at least one connector electrically connected to the electrical circuit. A housing accommodates therein the printed circuit board and comprises a base which supports the printed circuit board and a lid which closes over the base. At least one deformable, elastic, expanded blocking block is fixed to an internal surface of the lid near at least one electronic component, has sufficient thickness to vertically interfere with the first electronic component to be compressed between the lid and the first electronic component. It presents a larger area than the first electronic component to laterally encompass the first electronic component.

7 Claims, 6 Drawing Sheets

ELECTRONIC CONTROL UNIT WITH EXPANDED BLOCKS

The present invention relates to an electronic control unit.

The present invention finds advantageous application in an electronic control unit of an internal combustion engine, to which explicit reference will be made in the following description with no intention of limiting the general applicability of the invention.

BACKGROUND OF THE INVENTION

An electronic control unit for an internal combustion engine comprises a PCB (Printed Circuit Board), which supports an electronic circuit, a plurality of electric/electronic components electrically connected to the electric circuit, and at least one connector electrically connected to the electric circuit for connecting the electronic control unit to the internal combustion engine wiring. The printed circuit board is accommodated in a housing, which comprises a base which inferiorly supports the printed circuit board and a lid which superiorly closes the base.

An electronic control unit for an internal combustion engine is normally arranged inside an engine compartment near the internal combustion engine to be controlled; consequently, the electronic control unit must be capable of withstanding thermal stresses (from the low temperatures that a car parked in the open during the winter may reach to the high temperatures reached inside the engine compartment during operation of the internal combustion engine in summer), and mechanical stresses (vibrations deriving directly from the internal combustion engine, inertia stress deriving from driving the vehicle, and pulse stresses deriving from the road surface roughness/irregularities) alike without damage.

It has been observed that large-sized electric/electronic components (i.e. electrolytic capacitors) are particularly prone to mechanical stresses, because they are only inferiorly fixed (welded) to the printed circuit board and present a heavy mass (and thus a high mechanical inertia) having a center of gravity relatively distant from the printed circuit board.

In order to attempt to increase the mechanical strength of a large-sized electric/electrolytic component, it has been suggested to perform a peripheral resin-coating of the electric/electronic component itself at the printed board circuit; alternatively, it has been suggested to fix a plastic frame which surrounds and withholds the large-sized electric/electronic component to the printed circuit board. The mechanical solutions described above, however, while being effective are costly because they require additional, highly automated machining operations.

Patents DE2823666A1 and U.S. Pat. No. 6,123,565 A1 describe an electronic control unit for automotive applications, wherein the housing is completely filled with an expanded foam to limit the vibrations which are transmitted to the electric/electronic components; however, this constructive solution implies various drawbacks because it is costly, difficult to implement and makes any repair intervention on the electronic control unit extremely complicated.

SUMMARY OF THE INVENTION

It is the object of the present invention to make an electronic control unit which is free from the above-described drawbacks and is specifically easy and cost-effective to manufacture.

According to the present invention, an electronic control unit is made as claimed in the attached Claims.

BRIEF DESCRIPTION OF THE DRAWINGS

The present invention will now be described with reference to the accompanying drawings which illustrate a non-limiting example of embodiment thereof, in which.

DETAILED DESCRIPTION OF THE INVENTION

Figure 1:
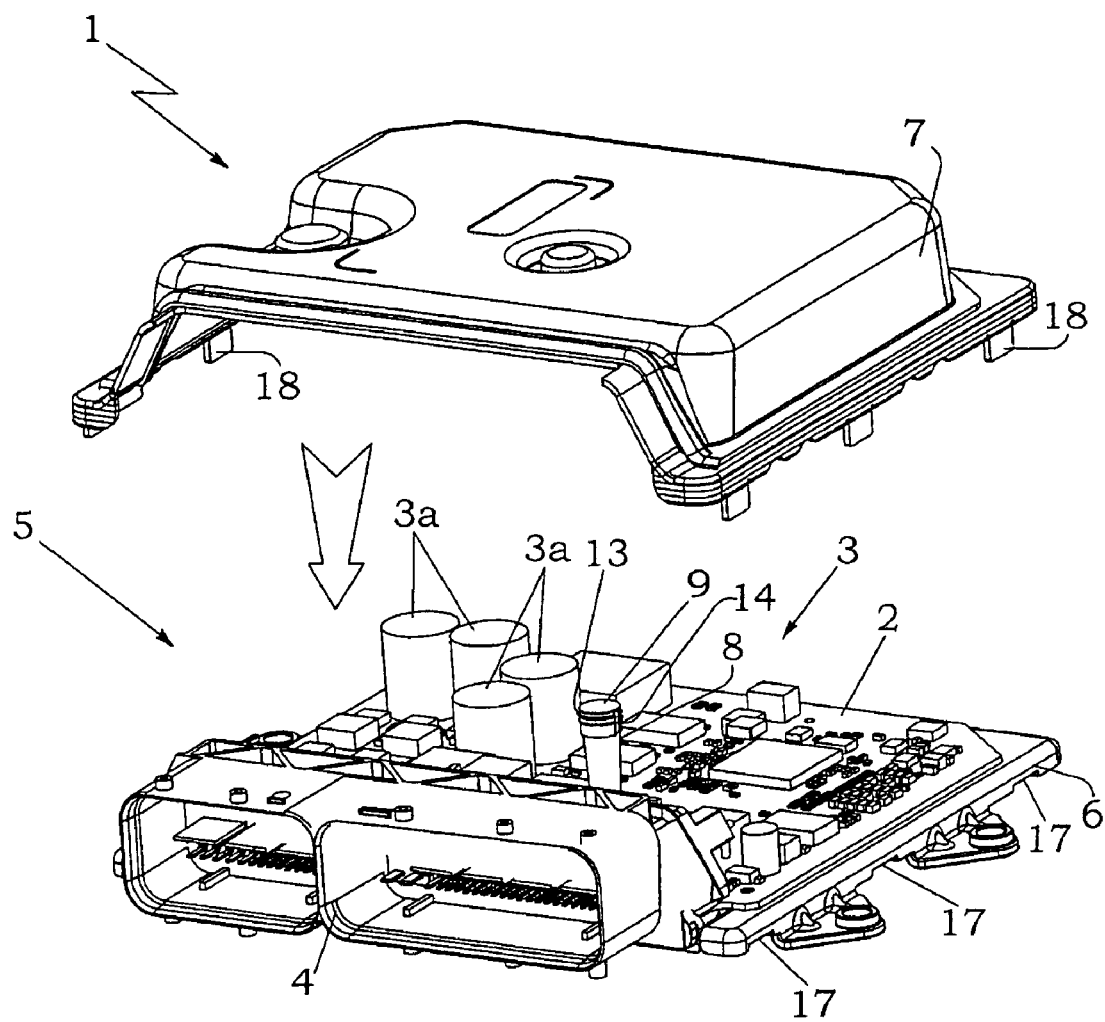
FIG. 1 is a perspective, exploded, diagrammatic view with parts removed for clarity of an electronic control unit for an internal combustion engine made according to the present invention.

In FIG. 1, numeral 1 indicates as a whole an electronic control unit for an internal combustion engine.

Electronic control unit 1 comprises a printed circuit board 2, which supports an electric circuit, a plurality of electric/electronic components 3 electrically connected to the electric circuit, and a connector 4 electrically connected to the electric circuit to connect electronic control unit 1 to the internal combustion engine wiring. Specifically, printed circuit board 2 supports four electrolytic capacitors 3a, which have a cylindrical shape and present large dimensions and a heavy mass.

Furthermore, electronic control unit 1 comprises a housing 5, which presents a rectangular shape in plan, accommodates therein printed circuit board 2 and comprises a base 6 which inferiorly supports printed circuit board 2 and a lid 7 which superiorly closes base 6. In addition to its natural containing and mechanical protection function, base 6 of housing 5 performs the function of heat sink for dissipating the heat which is produced by electric/electronic components 3. Consequently, printed circuit board 2 is arranged in contact with base 6 of housing 5 and a paste which is thermally conducting and electrically insulating may be interposed between the lower surface of printed circuit board 2 and the upper surface of base 6 of housing 5 in order to increase the heat exchange.

According to a preferred embodiment, base 6 and lid 7 of housing 5 are formed by aluminium sheet using pressing technology by cold rolling of aluminium castings; in the embodiment shown in the accompanying figures, base 6 has a thickness of 2.5 mm and lid 7 has a thickness of 1.5 mm.

Figure 3:
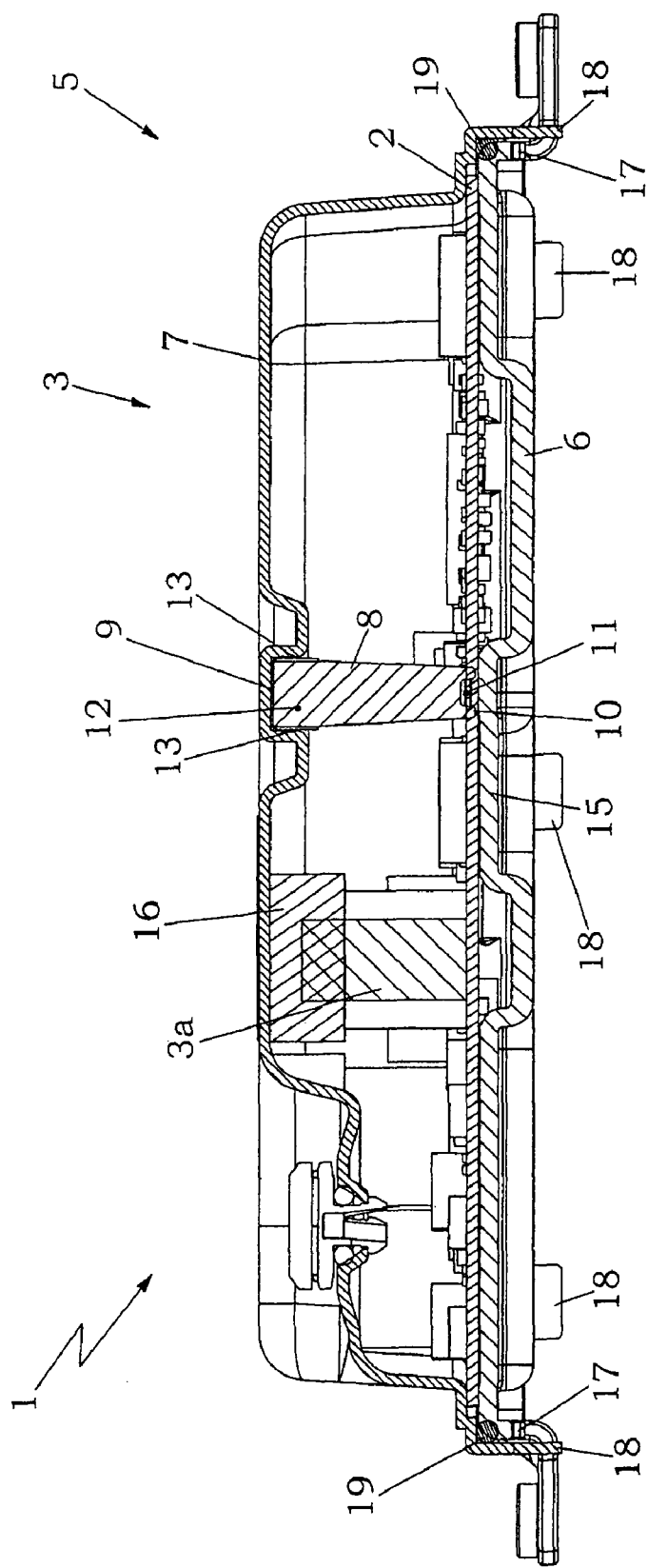
FIG. 3 is a side section view of the electronic control unit in FIG. 1.
Figure 4:
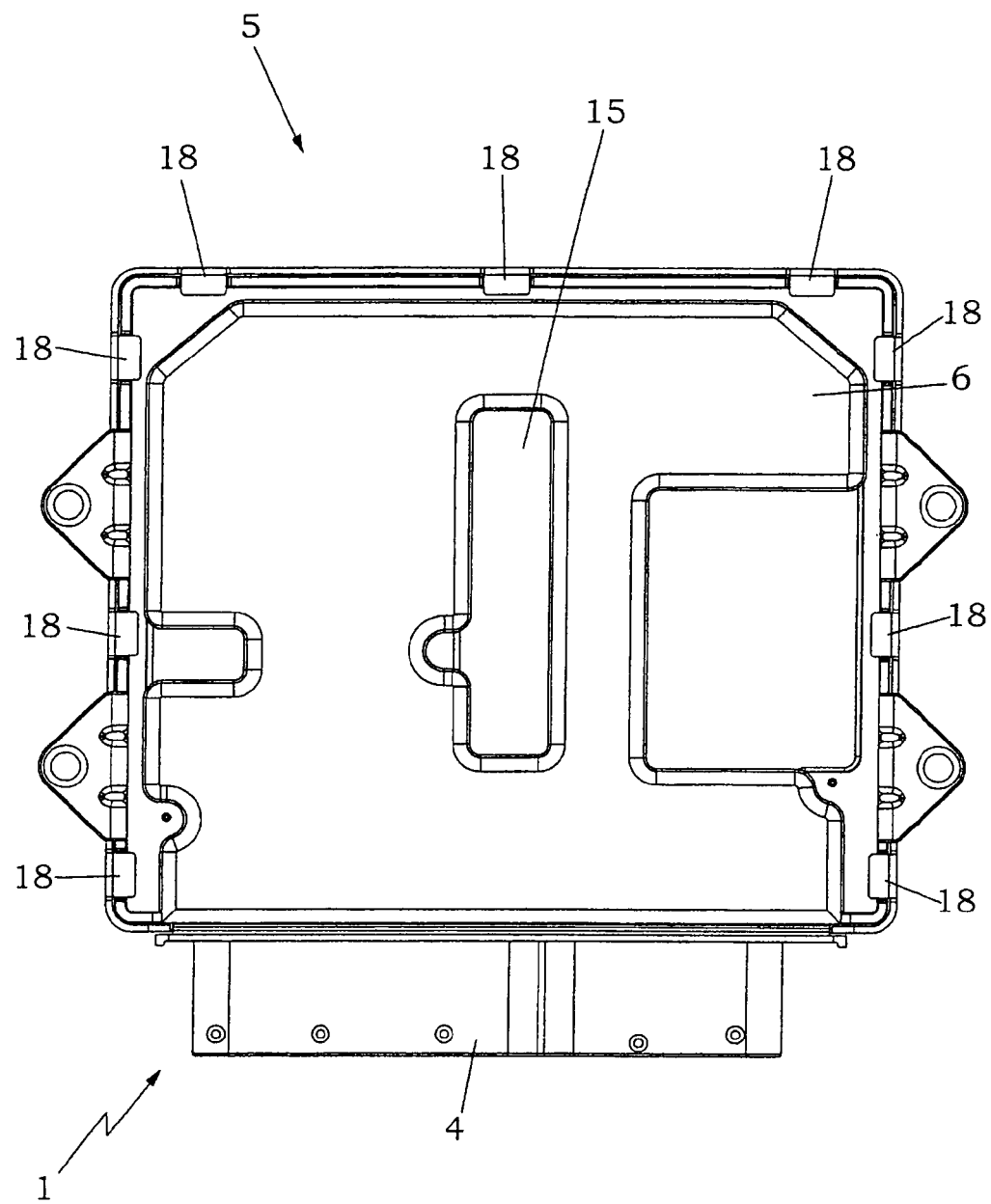
FIG. 4 is a bottom view of the electronic control unit in FIG. 1.

As shown in FIG. 3, in order to increase the heat exchange between printed board circuit 2 and base 6 of housing 5, it is necessary to keep printed circuit board 2 pressed against base 6 of housing 5 with a certain force. For this purpose, electronic control unit 1 comprises at least one pressing element 8, which is formed by electrically deformable material, is arranged in central position and is compressed between lid 7 and printed circuit board 2 for pressing with interference against printed circuit board 2.

Pressing element 8 presents a frustum-shape having a larger base 9 resting on lid 7 and a smaller base 10 resting on printed circuit board 2. According to a possible embodiment shown in the accompanying figures, smaller base 10 of pressing element 8 resting against printed circuit board 2 is rounded and presents a central blank hole 11. The function of central blank hole 11 is to confer a "suction cap" effect to smaller base 10 resting on printed circuit board 2 for increasing the transversal withholding force.

According to a preferred embodiment shown in the accompanying figures, lid 7 comprises an annular seat 12 which is cup-shaped and accommodates larger base 9 of pressing element 8 resting on lid 7. In order to increase the withholding force of pressing element 8 within seat 12, pressing element 8 presents two annular bulges 13 which are dimensioned by interference within seat 12. Moreover, in order to further increase the withholding force of pressing element 8 within seat 12, larger base 9 of pressing element 8 is fixed to lid 7 by gluing; i.e. a drop of glue (resin) is inserted inside seat 12 before driving larger base 9 of pressing element 8 inside seat 12. Preferably, pressing element 8 presents two axial side channels 14 to relieve the glue in excess at base 9; i.e. the glue in excess present inside seat 12 may leak from seat 12 during the driving of larger base 9 of pressing element 8 through two side channels 14.

According to a preferred embodiment, pressing element 8 is formed by silicone having for example a hardness of 80±5 shoreA. In the embodiment shown in the accompanying figures, pressing element 8 has a total height of 27 mm, larger base 9 has a diameter of 10 mm, smaller base 10 has a diameter of 7 mm and central blank hole 11 of smaller base 10 has a diameter of 4 mm. Furthermore, in the embodiment shown in the accompanying figures, pressing element 8 is compressed between lid 7 and printed circuit board 2 with a theoretical interference equal to 1.2 mm (more generally comprised between 1 mm and 1.5 mm).

According to a preferred embodiment, base 6 of housing 5 presents a contrast plane 15, which is arranged at pressing element 8 and constitutes a resting surface for printed circuit board 2 so as to act as a mechanical contrast for pressing element 8. In other words, without contrasting plane 15, printed circuit board 2 would centrally bend in undesired manner under the bias of pressing element 8.

According to a preferred embodiment, printed circuit board 2 is free from electric/electronic components 3 and weldings in the resting zone of pressing element 8 in order to prevent possible electric/electronic components 3 from being damaged in time by the pressure exerted by pressing element 8.

Figure 2:
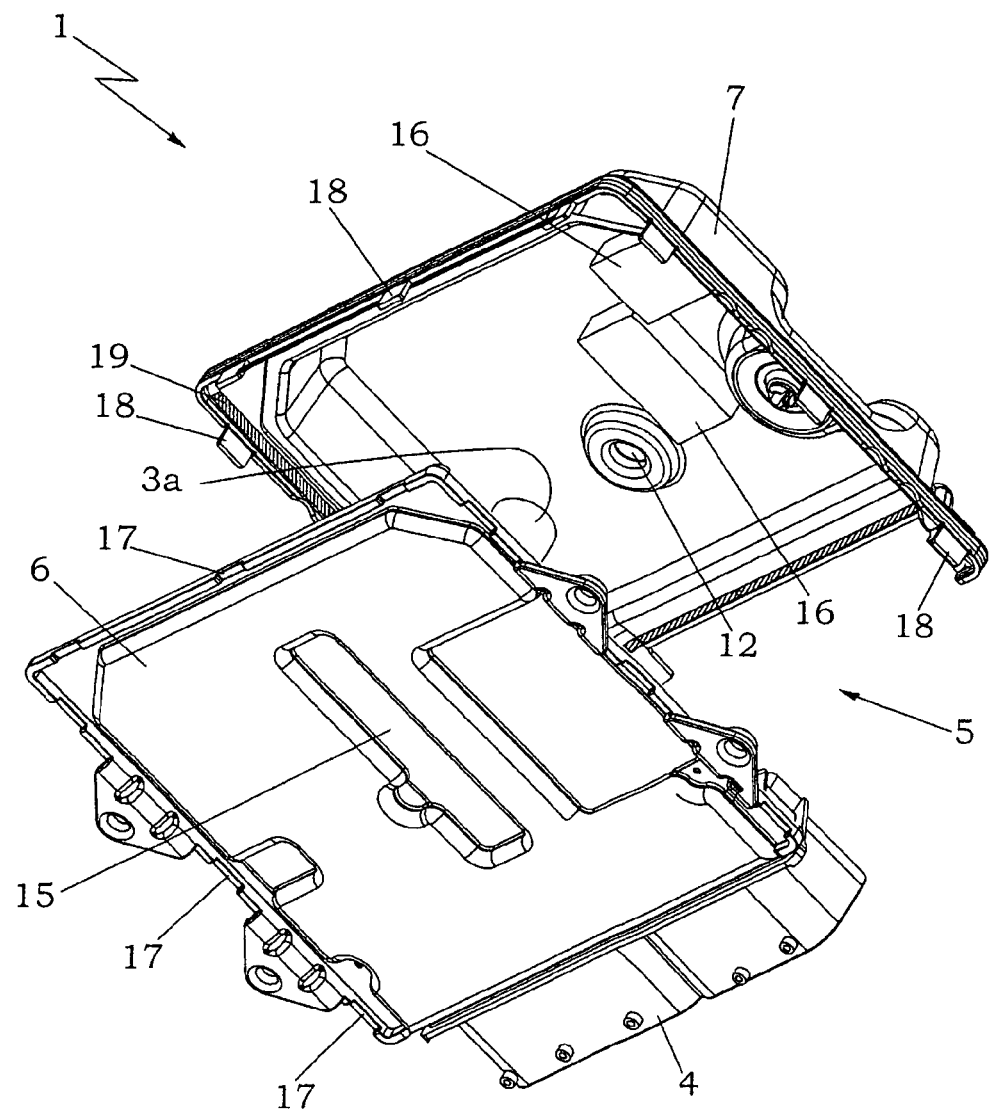
FIG. 2 is a further perspective, exploded, diagrammatic view with parts removed for clarity of the electronic control unit in FIG. 1.

As shown in FIGS. 2 and 3, electronic control unit 1 comprises two blocking blocks 16 formed by deformable, expanded, elastic material, each of which is fixed (preferably glued) to an internal surface of lid 7 at two corresponding electrolytic capacitors 3a, presents a sufficient thickness so as to determine a vertical interference with the corresponding two electrolytic capacitors 3a to be compressed between lid 7 and electrolytic capacitors 3a, and presents a larger area with respect to electrolytic capacitors 3a to laterally encompass electrolytic capacitors 3a themselves.

In order words, each blocking block 16 by deforming superiorly and laterally encompasses corresponding electrolytic capacitors 3a contributing both to the axial withholding and to the lateral withholding of electronic capacitors 3a themselves. In virtue of the slight axial compression exerted by blocking blocks 16 on electrolytic capacitors 3a, electrolytic capacitors 3a themselves are essentially free from significant vibrations.

In the embodiment shown in the accompanying figures, each undeformed blocking block 16 presents a thickness of 10 mm and presents an interference of approximately 5 mm with electrolytic capacitors 3a.

According to a preferred embodiment, blocking blocks 16 are formed by open-cell expanded material because such material presents an optimal response to vibrations. For example, blocking blocks 16 may be formed by expanded polyurethane resin presenting a PPI equal to 20 and an ISO 845 density from 26 to 32 kg/m$^3$.

Figure 5:
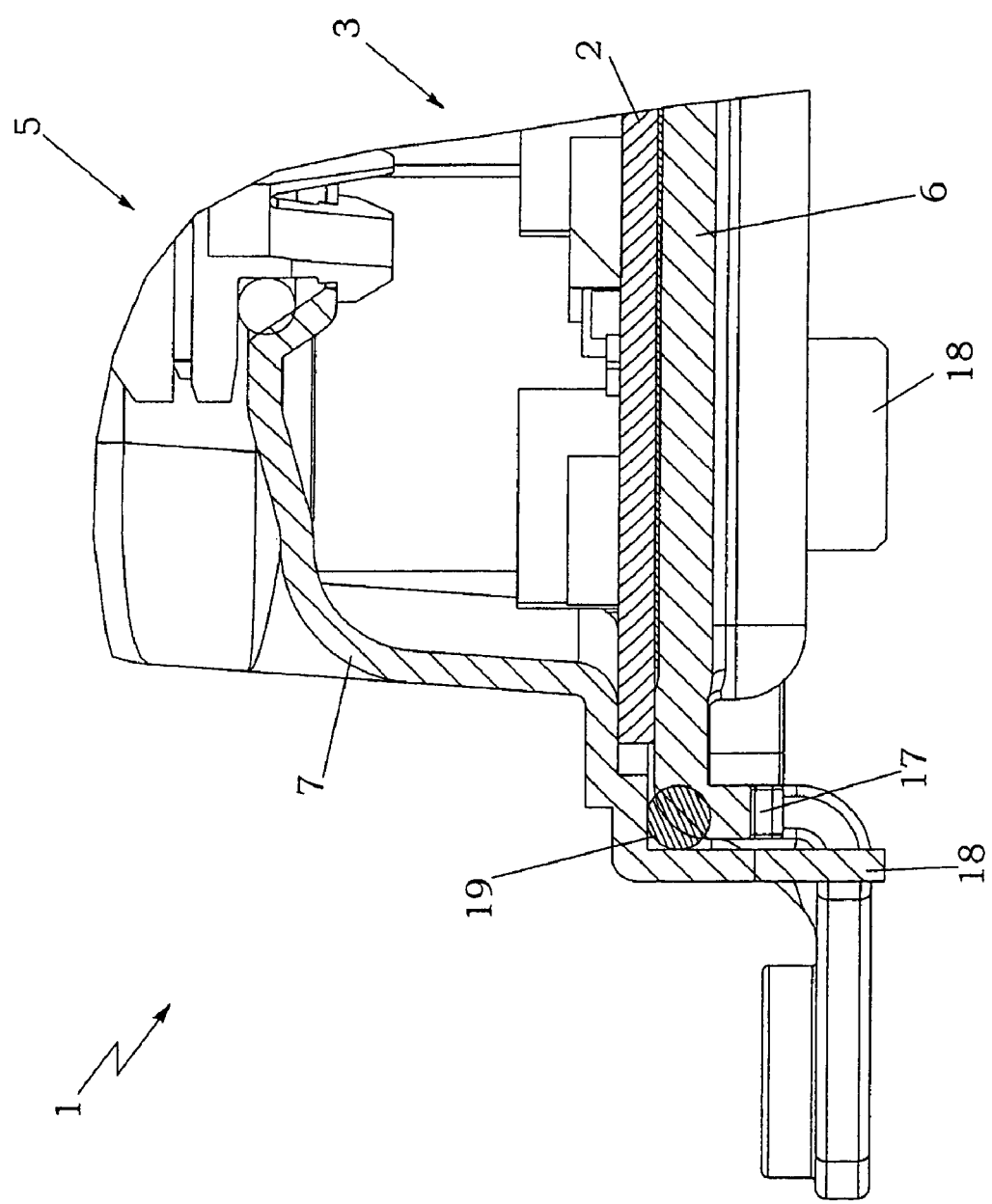
FIGS. 5 and 6 are two side section views of a fastening fin of the electronic control unit in FIG. 1 in an assembly configuration and in a fastening configuration, respectively.
Figure 6:
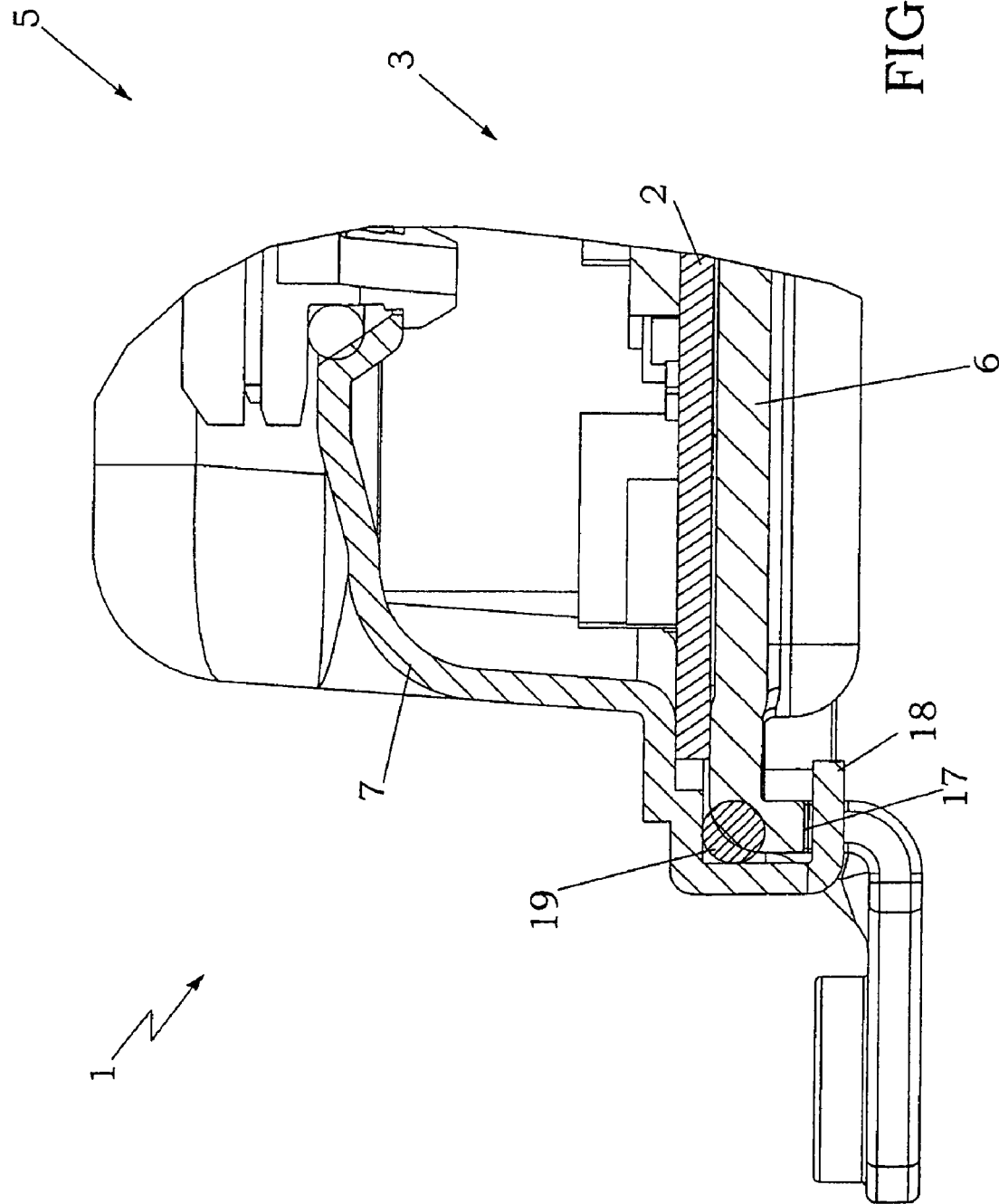

As shown in FIGS. 2-6, base 6 comprises a plurality of fastening seats 17 and lid 7 comprises a plurality of fastening fins 18, each of which is arranged at a corresponding fastening seat 17, is initially flat (FIG. 5), and is adapted to be plastically folded by at least 90° inside corresponding fastening seat 17 and against base 6 for fixing lid 7 to base 6 (FIG. 6).

In order words, lid 7 is fixed to base 6 by means of metallic fastening fins 17, which are integrally obtained in lid 7 (i.e. are monolithic with lid 7) and are plastically deformed (i.e. without subsequent elastic return) to encompass base 6; in this manner, it is possible to avoid the use of fastening screws.

According to a preferred embodiment, fastening fins 18 present a rectangular shape. Furthermore, in the embodiment shown in the accompanying figures, nine fastening fins 18 and nine fastening seats 17 symmetrically distributed in threes are contemplated on three sides of housing 5.

As shown in FIGS. 3, 5 and 6, a resin 19 having the function of adhesive seal, which adheres to the contact surfaces by polymerizing after housing 5 is closed, is interposed between lid 7 and base 6; resin 19 is dispensed with a circular section and then compressed by closing container 5 and filling the empty spaces.

The above-described electronic control unit 1 presents a number of advantages, because it is simple and cost-effective to manufacture and allows to considerably limit the mechanical stresses which act on large-sized electric/electronic components 3a.

The invention claimed is:

1. An electronic control unit, comprising:
a printed circuit board, which supports an electric circuit, a plurality of electric/electronic components electrically connected to the electric circuit, and at least one connector electrically connected to the electrical circuit; wherein the electric/electronic components include at least one electrolytic capacitor which has a cylindrical shape and is higher than all the other electric/electronic components;
a housing, which accommodates therein the printed circuit board and comprises a base which inferiorly supports the printed circuit board and a lid which superiorly closes the base; and
at least one deformable, elastic, expanded material blocking block, which is fixed to an internal surface of the lid near the capacitor presents a thickness sufficient so as to determine a vertical interference with the capacitor to be compressed between the lid and the capacitor while, at the same time, to not touch any other of the electric/electronic components, presents a larger area than the capacitor to laterally encompass the capacitor, and presents a narrower area than the printed circuit board so as to be located only above the capacitor.

2. An electronic control unit according to claim 1 wherein the blocking block encompasses the capacitor with an interference of approximately 5 mm.

3. An electronic control unit according to claim 2, wherein the undeformed blocking block presents a thickness of approximately 10 mm.

4. An electronic control unit according to claim 1, wherein the blocking block is formed by open-cell expanded material.

5. An electronic control unit according to claim 4, wherein the blocking block is formed by expanded polyurethane resin.

6. An electronic control unit according to claim 5, wherein the expanded polyurethane resin presents a PPI equal to 20.

7. An electronic control unit according to claim 5, wherein the expanded polyurethane resin presents an ISO 845 density from 26 to 32 kg/m$^3$.

\* \* \* \* \*

UNITED STATES PATENT AND TRADEMARK OFFICE
CERTIFICATE OF CORRECTION

| | | |
|---|---|---|
| PATENT NO. | : 7,916,491 B2 | Page 1 of 1 |
| APPLICATION NO. | : 12/122824 | |
| DATED | : March 29, 2011 | |
| INVENTOR(S) | : Endrio Fino et al. | |

It is certified that error appears in the above-identified patent and that said Letters Patent is hereby corrected as shown below:

Title page should read

(73) Assignee: Magneti Marelli Powertrain S.p.A. (IT)

Signed and Sealed this
Ninth Day of August, 2011

David J. Kappos
*Director of the United States Patent and Trademark Office*